US012647056B2

(12) United States Patent (10) Patent No.: US 12,647,056 B2
Kjær et al. (45) Date of Patent: Jun. 2, 2026

(54) METHOD FOR DETERMINING A MOTOR TYPE OF AN ELECTRIC MOTOR AND MOTOR CONTROL APPARATUS

(71) Applicant: Danfoss Power Electronics A/S, Gråsten (DK)

(72) Inventors: Ana-Mari Tataru Kjær, Harrislee (DE); Sanjeet Kumar Dwivedi, Gråsten (DK); Thiruvenkadam Madhulingam, Chennai (IN); Katuri Gudaru Venkaiah, Oragadam (IN)

(73) Assignee: DANFOSS POWER ELECTRONICS A/S, Gråsten (DK)

( * ) Notice: Subject to any disclaimer, the term of this patent is extended or adjusted under 35 U.S.C. 154(b) by 268 days.

(21) Appl. No.: 18/192,366

(22) Filed: Mar. 29, 2023

(65) Prior Publication Data

US 2023/0318499 A1 Oct. 5, 2023

(30) Foreign Application Priority Data

Apr. 1, 2022 (DE) .......................... 102022107869.8

(51) Int. Cl.
*H02P 21/14* (2016.01)
*G01R 19/04* (2006.01)
(52) U.S. Cl.
CPC .............. *H02P 21/14* (2013.01); *G01R 19/04* (2013.01)

(58) Field of Classification Search
CPC ...... H02P 21/14; H02P 21/0003; H02P 21/22; G01R 19/04; G01R 31/34
See application file for complete search history.

(56) References Cited

U.S. PATENT DOCUMENTS

| | | | | |
|---|---|---|---|---|
| 10,320,594 | B2 * | 6/2019 | Poley | G01D 5/2451 |
| 2017/0319909 | A1 * | 11/2017 | Freeman | A01K 15/025 |
| 2019/0081533 | A1 * | 3/2019 | Evreinov | A63F 13/28 |
| 2019/0207524 | A1 * | 7/2019 | Mnich | H02M 3/33573 |
| 2019/0280631 | A1 * | 9/2019 | Thoelke | H02P 6/185 |
| 2019/0319564 | A1 * | 10/2019 | Hecker | H02P 21/18 |
| 2019/0386517 | A1 * | 12/2019 | Liu | H02M 3/3376 |
| 2020/0143982 | A1 * | 5/2020 | Rochford | H01F 38/14 |
| 2020/0274471 | A1 * | 8/2020 | Liu | H02P 27/12 |
| 2021/0135614 | A1 * | 5/2021 | Huxford | H02P 21/13 |

FOREIGN PATENT DOCUMENTS

WO 2016/005790 A1 1/2016

* cited by examiner

*Primary Examiner* — Lee E Rodak
*Assistant Examiner* — Zannatul Ferdous
(74) *Attorney, Agent, or Firm* — McCormick, Paulding & Huber PLLC

(57) ABSTRACT

A method for determining a motor type of an electric motor includes several phases, wherein two or more pulses are applied to the motor, respective currents are measured and the motor type is determined based on the pulses. Further, a motor control apparatus is configured to perform such a method.

22 Claims, 3 Drawing Sheets

METHOD FOR DETERMINING A MOTOR TYPE OF AN ELECTRIC MOTOR AND MOTOR CONTROL APPARATUS

CROSS-REFERENCE TO RELATED APPLICATION

This application claims foreign priority benefits under 35 U.S.C. § 119 from German Patent Application No. 102022107869.8, filed Apr. 1, 2022, the content of which is hereby incorporated by reference in its entirety.

TECHNICAL FIELD

The invention relates to a method for determining a motor type of an electric motor and to a motor control apparatus being configured to perform such a method.

BACKGROUND

Electric motors are used in a variety of applications. In many cases it is important to identify which type of motor is connected to a motor control apparatus, an inverter, or another device, as it is not always determined prior to use which type is used in a specific application. Many motor control apparatuses are able to handle different motor types and in many cases, it is not easy to ensure that the type of motor used in a specific application is set correctly.

SUMMARY

It is thus an object of the invention to provide for a method for determining a motor type and to provide for a corresponding motor control apparatus. This is achieved by a method and a motor control apparatus according to the independent claims. Preferred embodiments can, for example, be derived from the respective dependent claims.

The invention relates to a method for determining a motor type of an electric motor having several phases. The method comprises the following steps:

applying two or more pulses to the motor, each pulse representing a vector with respect to the phases, measuring respective time-resolved currents while applying the pulses, analyzing at least some of the currents, and determining the motor type based on the currents.

It has been found that the currents measured during applying such pulses can be used in order to determine a motor type. The method is suitable for electric motors having several phases, wherein in normal cases they have three phases.

A pulse is typically an application of a voltage for a certain time between two connectors of the electric motor. A time-resolved current is typically a current measured at a plurality of points of time during the pulse. For example, these predefined points of time can have a constant distance in time to each other, so that an indication about a time evolution of the current can be achieved.

Analyzing the currents may comprise determining a pulse with highest peak current and a pulse with lowest peak current. This means that peak currents of each pulse are determined and it is further determined which pulse has the highest peak current and which pulse has the lowest peak current. Peak currents can especially be determined as being the highest current, or the highest magnitude of a current, in a respective pulse.

A saliency indicator may be calculated as a ratio between the highest peak current and the lowest peak current. Such a saliency indicator may be used in determining if the electric motor is a salient motor or not.

Analyzing the currents may comprise determining a pulse with highest peak current and a pulse opposite thereto. The pulse opposite thereto may especially be a pulse with a phase difference of 180° compared with the pulse with highest peak current.

A respective function may be fitted to the pulse with highest peak current and to the pulse opposite thereto. This may be used in order to make further evaluation.

For example, the function may be a third order polynomial function with coefficients a, b, c, and d:

$$y=ax^3+bx^2+cx+d.$$

For both the pulse with highest peak current and the pulse with lowest peak current the coefficients may be classified into one of four classes:

class A: if a has positive sign, b has positive sign, c has positive sign, class B: if a has positive sign, b has negative sign, c has positive sign, class C: if a has negative sign, b has positive sign, c has positive sign, class D: if a has negative sign, b has negative sign, c has positive sign.

This allows to classify the connected electric motor in order to determine its type in more detail.

Determining the motor type may comprise performing a shape-based determination of the motor type, wherein ASM or SRM is detected if the coefficients of the pulse with highest peak current are classified in class C, and if the coefficients of the pulse with lowest peak current are classified in class C, SPM or IPM are detected if the coefficients of the pulse with highest peak current are classified in class B, and if the coefficients of the pulse with lowest peak current are classified in class B, and PMaSynRM is detected if the coefficients of the pulse with highest peak current are classified in class B, and if the coefficients of the pulse with lowest peak current are classified in class C.

The abbreviations mean:

ASM=Asynchronous Motor

SPM=Surface Permanent Magnet Motor

SRM=Synchronous Reluctance Motor

IPM=Interior Permanent Magnet Motor

PMaSynRM=Permanent Magnet Assisted Synchronous Reluctance Motor

This approach leads to a classification of the motor type into three groups of types simply based on coefficients and determined classes which do not need much computing power. This can be called a shape-based determination.

Classes A and D may be used for special types of motors which are not mentioned here.

The current of the pulse opposite to the pulse with highest peak current may be scaled to the current of the pulse with highest peak current. The two opposite current pulses may actually have different magnitude and different slope. Scaling means especially that the magnitude of the smaller pulse (typically the opposite pulse) is extrapolated up to the magnitude of the higher pulse (typically the pulse with highest peak current). This may be necessary for a comparison of pulses with help of a sum of a square error function. The scaled pulses may be used in all further determination after the scaling.

A sum of square errors may be calculated between the current of the pulse with highest peak current and the pulse opposite thereto. Especially, a scaled pulse may be used as the pulse opposite thereto.

Determining the motor type may comprise performing a calculation-based determination of the motor type based on predefined sectors in a diagram having the saliency indicator on one axis and the sum of square errors on the other axis, wherein each predefined sector may correspond to one motor type. These sectors may also overlap. By defining such sectors, the two indicators "saliency indicator" and "sum of square errors" may be used to make a two-dimensional determination of the motor type, so that based on an entry in a two-dimensional diagram and based on the sector in which this entry is comprised a motor type determination can be made.

The shape-based determination may be used for disambiguation if the calculation-based determination yields two different possible motor types. This can especially occur if an entry in a two-dimensional diagram is in an overlap of at least two sectors. Then the shape-based determination which has been explained above, can be used for disambiguation.

A pulse with highest current derivative may be identified, and a magnetization direction may be calculated based on the pulse with highest current derivative. It may especially be derived from a derivative of the formula given above:

$$dy/dx = 3ax^2 + 2bx + c.$$

The method may comprise applying a positive pulse and a negative pulse to each phase. This leads to a better determination of the motor type. The pulses may especially have equal magnitude and voltage.

Especially, the motor may have three phases. However, the method may in principle also be used for motors having more than three phases.

The invention relates further to a motor control apparatus being configured to perform a method as disclosed herein. With regard to the method, all embodiments and variations as disclosed herein can be applied.

BRIEF DESCRIPTION OF THE DRAWINGS

The invention will now be further described with respect to the accompanying drawings, wherein.

DETAILED DESCRIPTION

Figure 1:
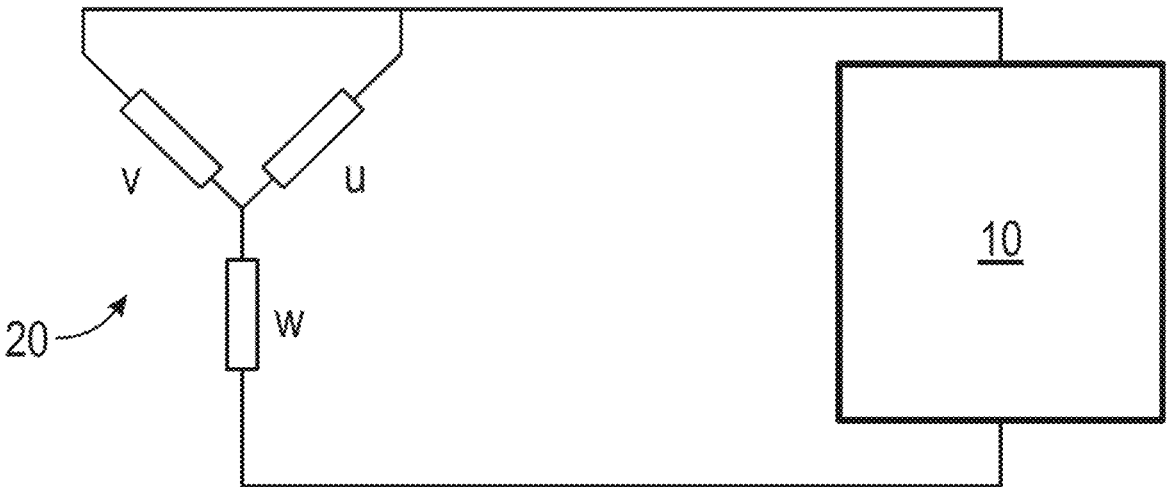
FIG. 1 shows a motor control apparatus and a motor.

FIG. 1 shows schematically a motor control apparatus 10 and a connected electric motor 20. The motor 20 has three phases u, v, w that are connected to the motor control apparatus 10. The phases are connected to each other at a central point. The motor control apparatus 10 is typically configured to provide electric power to the electric motor 20 and also to perform certain control and surveillance functions.

Figure 2:
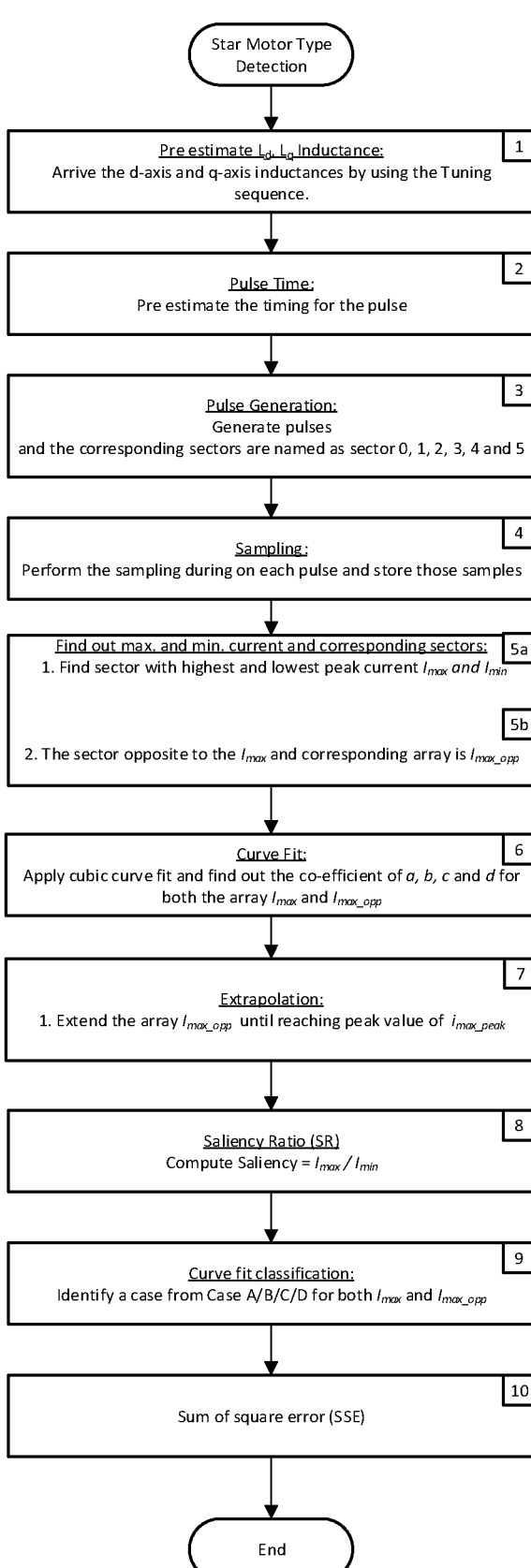
FIG. 2 shows a flow diagram.

When a motor is connected to the motor control apparatus 10, or at any other point in time when it is required, the motor control apparatus 10 may perform a method as shown in FIG. 2.

At first, motor type detection is started.

In step 1, a pre-estimate of inductances $L_d$, $L_q$ is performed. The d-axis inductance $L_d$ and the q-axis inductance $L_q$ may especially be estimated by using a tuning sequence.

In step 2, a pulse time is pre-estimated by multiplying the d-axis inductance $L_d$ with a saturation current $I_{sat}$ and by dividing the value by the DC voltage $U_{dc}$.

In step 3, a pulse generation is performed. In detail, pulses denoted as 001, 110, 010, 101, 001 and 110 are applied. Each triple of numbers represents a pulse, wherein a 0 represents that no voltage is applied to a respective phase in the order uvw and a 1 indicates that a voltage is applied to the respective phase. The corresponding sectors may be named as sectors 0, 1, 2, 3, 4, and 5.

In step 4, a sampling is performed during each pulse and the respective samples are stored in respective arrays of $I_{u+}$, $I_{u-}$, $I_{v+}$, $I_{v-}$, $I_{w+}$, $I_{w-}$. Those samples correspond to the sectors mentioned in step 3 and the corresponding generated pulses.

In step 5a, the sectors which have the highest and lowest peak currents are determined and are named $I_{max}$ and $I_{min}$. In step 5b, the sector opposite to the $I_{max}$ and corresponding array is named $I_{max\_opp}$ The number of samples available from those both arrays is $n_{max}$.

A current $I_{max}$ is defined as the maximum peak current of the pulse with highest peak current. A further current $I_{max\_opp}$ is defined as the maximum current of the opposite pulse.

In step 6, a curve fit is performed. Especially, a cubic curve fit may be performed and coefficients a, b, c and d for both $I_{max}$ and $I_{max\_opp}$ may be found.

In step 7, an extrapolation is performed. The array $I_{max\_opp}$ is extended until reaching the peak value of the pulse with highest current peak or until linear increase by using the formula $I = at^3 + bt^2 + ct + d$. The number of samples is noted.

If the array $I_{max\_opp}$ is completely extrapolated at some current level of array $I_{max}$, the common peak current value is the end index value $I_{max}$.

In step 8, a saliency ratio is calculated by dividing the maximum current through the minimum current.

In step 9, a curve fit is performed and cases a, b, c, d are identified as described above.

In step 10, the sum of square errors is calculated in order to have an indication of the sum of square errors between the two pulses.

For example, the following formula can be used:

$$MeanSquareError = \frac{\sum_{1}^{Nsamples}\left(\frac{\left(\frac{di}{dt}\right)max - \left(\frac{di}{dt}\right)opposite}{\left(\frac{di}{dt}\right)max}\right)^2}{N_{sample}} \cdot 100$$

The value Nsamples is the maximum number of samples, and it is a current which is denoted as relating to the pulse with maximum peak current (max) and the opposite pulse (opposite).

Figure 3:
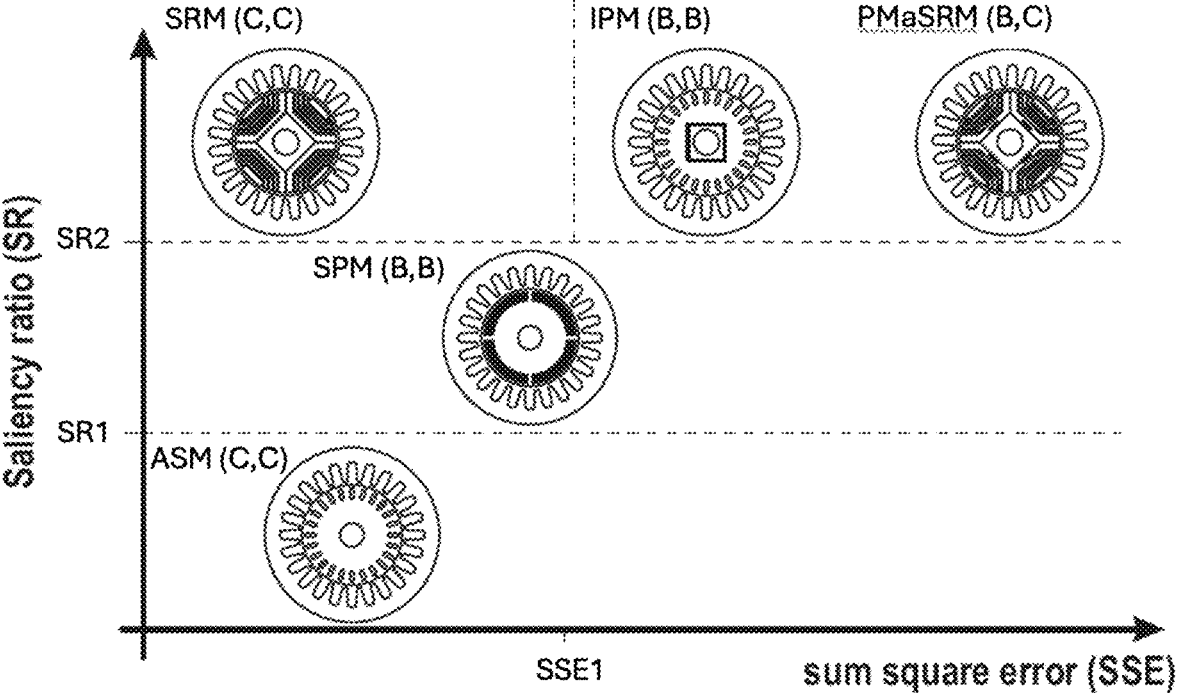
FIG. 3 shows a two-dimensional diagram with sectors.

After all these calculations, the saliency rate and the sum square error are put into a diagram as shown in FIG. 3. The diagram is split into four sectors, which in principle may overlap, but do not overlap in the present case. Each motor yields a combination of saliency ratio and sum square error which can be identified in the diagram and can be seen as being in one of the sectors.

The lowermost sector, comprising values of the saliency ratio up to a value SR1, corresponds to an asynchronous motor (ASM). The vertically middle sector, comprising values of the saliency ratio of more than the value SR1 and up to a value SR2, corresponds to a surface permanent magnet motor (SPM). The upper left sector, comprising values of the sum square error of up to a value SSE1, corresponds to a synchronous reluctance motor (SRM). The upper right sector, comprising values of the sum square error of more than the value SSE1, may correspond to an interior permanent magnet motor (IPM) or to a permanent magnet assisted synchronous reluctance motor (PMaSynRM). Both upper sectors comprise values of the saliency ratio of more than the value SR2. A disambiguation between the last two types can be made by using coefficients that can be calculated out of the samples as described above.

While the present disclosure has been illustrated and described with respect to a particular embodiment thereof, it should be appreciated by those of ordinary skill in the art that various modifications to this disclosure may be made without departing from the spirit and scope of the present disclosure.

What is claimed is:

1. A method for determining a motor type of an electric motor having several phases and for controlling the motor using a motor control apparatus, the method comprising the following steps:

applying two or more pulses to the electric motor, each pulse representing a vector with respect to the phases, measuring respective time-resolved currents while applying the pulses, analyzing at least some of the currents, determining the motor type based on the currents, and controlling the electric motor, using the motor control apparatus, as an Asynchronous Motor (ASM) when the saliency indicator is less than a first value, wherein analyzing the currents comprises determining a pulse with highest peak current and a pulse with lowest peak current, and wherein a saliency indicator is calculated as a ratio between the highest peak current and the lowest peak current.

2. The method according to claim 1, wherein analyzing the currents comprises determining a pulse with highest peak current and a pulse opposite thereto.

3. The method according to claim 2, further comprising the following step:

fitting a respective function to the pulse with highest peak current and to the pulse opposite thereto.

4. The method according to claim 3, wherein the function is a third order polynomial function for current y versus time x with coefficients a, b, c, and d:

$$y = ax^3 + bx^2 + cx + d.$$

5. The method according to claim 4, further comprising:

fitting a respective function to the pulse with lowest peak current and to the pulse opposite thereto, wherein the function is a third order polynomial function for current y versus time x with coefficients a, b, c, and d:

$$y = ax^3 + bx^2 + cx + d,$$

wherein, for both the pulse with highest peak current and the pulse with lowest peak current, the coefficients are classified into one of four classes:

Class A: if a has positive sign, b has positive sign, c has positive sign,

Class B: if a has positive sign, b has negative sign, c has positive sign,

Class C: if a has negative sign, b has positive sign, c has positive sign,

Class D: if a has negative sign, b has negative sign, c has positive sign.

6. The method according to claim 5, wherein determining the motor type comprises performing a shape-based determination of the motor type, wherein ASM or SRM is detected if the coefficients of the pulse with highest peak current are classified in class C, and if the coefficients of the pulse with lowest peak current are classified in class C, SPM or IPM is detected if the coefficients of the pulse with highest peak current are classified in class B, and if the coefficients of the pulse with lowest peak current are classified in class B, and PMaSynRM is detected if the coefficients of the pulse with highest peak current are classified in class B, and if the coefficients of the pulse with lowest peak current are classified in class C.

7. The method according to claim 6, wherein analyzing the currents comprises determining a pulse with highest peak current and a pulse opposite thereto, wherein a sum of square errors is calculated between the current of the pulse with highest peak current and the pulse opposite thereto, wherein determining the motor type comprises performing a calculation-based determination of the motor type based on predefined sectors in a diagram having the saliency indicator on one axis and the sum of square errors on the other axis, wherein each predefined sector corresponds to one motor type, and wherein the shape-based determination is used for disambiguation if at least two of the predefined sectors corresponding to one motor type in the calculation-based determination overlap and if the calculated saliency indicator and the calculated sum of square errors lies within the overlap.

8. The method according to claim 2, wherein the current of the pulse opposite to the pulse with highest peak current is scaled to the current of the pulse with highest peak current.

9. The method according to claim 2, wherein a sum of square errors is calculated between the current of the pulse with highest peak current and the pulse opposite thereto.

10. The method according to claim 9, wherein determining the motor type comprises performing a calculation-based determination of the motor type based on predefined sectors in a diagram having the saliency indicator on one axis and the sum of square errors on the other axis, wherein each predefined sector corresponds to one motor type.

11. The method according to claim 1, wherein a pulse with highest current derivative is identified, and wherein a magnetization direction is calculated based on the pulse with highest current derivative.

12. The method according to claim 1, wherein the method comprises applying a positive pulse and a negative pulse to each phase.

13. The method according to claim 1, wherein the pulses have equal magnitude in voltage.

14. The method according to claim 1, wherein the motor has three phases.

15. A motor control apparatus being configured to perform the method according to claim 1.

16. The method according to claim 1, further comprising controlling the electric motor, using the motor control apparatus, as a Surface Permanent Magnet Motor (SPM) when the saliency indicator is greater than the first value and less than a second value.

17. The method according to claim 16, further comprising controlling the electric motor, using the motor control apparatus, as a Synchronous Reluctance Motor (SRM) or an Interior Permanent Magnet Motor (IPM) or a Permanent Magnet Assisted Synchronous Reluctance Motor (PMaSynRM) when the saliency indicator is greater than the second value.

18. A method for determining a motor type of an electric motor having several phases and for controlling the motor using a motor control apparatus, the method comprising the following steps:

applying two or more pulses to the electric motor, each pulse representing a vector with respect to the phases, measuring respective time-resolved currents while applying the pulses, analyzing at least some of the currents, and determining the motor type based on the currents, controlling the electric motor using the motor control apparatus based on the determined motor type, wherein analyzing the currents comprises determining a pulse with lowest peak current and a pulse opposite thereto, and wherein analyzing the currents comprises determining a pulse with highest peak current and a pulse opposite thereto; and further comprising the following steps:

fitting a respective function to the pulse with lowest peak current and to the pulse opposite thereto, wherein the function is a third order polynomial function for current y versus time x with coefficients a, b, c, and d:

$$y=ax\char`^3+bx\char`^2+cx+d, \text{ and}$$

fitting a respective function to the pulse with highest peak current and to the pulse opposite thereto, wherein the function is a third order polynomial function for current y versus time x with coefficients a, b, c, and d:

$$y=ax\char`^3+bx\char`^2+cx+d,$$

wherein if a has negative sign, b has positive sign and c has positive sign for the pulse with lowest peak current and if a has negative sign, b has positive sign and c has positive sign for the pulse with highest peak current, then controlling the electric motor, using the motor control apparatus, as an Asynchronous Motor (ASM) or as a Synchronous Reluctance Motor (SRM).

19. The method according to claim 18, wherein, for both the pulse with highest peak current and the pulse with lowest peak current, the coefficients are classified into one of four classes:

Class A: if a has positive sign, b has positive sign, c has positive sign,

Class B: if a has positive sign, b has negative sign, c has positive sign,

Class C: if a has negative sign, b has positive sign, c has positive sign,

Class D: if a has negative sign, b has negative sign, c has positive sign.

20. The method according to claim 19, wherein determining the motor type comprises performing a shape-based determination of the motor type, wherein ASM or SRM is detected if the coefficients of the pulse with highest peak current are classified in class C, and if the coefficients of the pulse with lowest peak current are classified in class C, SPM or IPM is detected if the coefficients of the pulse with highest peak current are classified in class B, and if the coefficients of the pulse with lowest peak current are classified in class B, and PMaSynRM is detected if the coefficients of the pulse with highest peak current are classified in class B, and if the coefficients of the pulse with lowest peak current are classified in class C.

21. The method according to claim 20, wherein a saliency indicator is calculated as a ratio between the highest peak current and the lowest peak current, wherein analyzing the currents further comprises determining a pulse with highest peak current and a pulse opposite thereto, wherein a sum of square errors is calculated between the current of the pulse with highest peak current and the pulse opposite thereto, and wherein determining the motor type comprises performing a calculation-based determination of the motor type based on predefined sectors in a diagram having the saliency indicator on one axis and the sum of square errors on the other axis, wherein each predefined sector corresponds to one motor type.

22. The method according to claim 21, wherein the shape-based determination is used for disambiguation if at least two of the predefined sectors corresponding to one motor type in the calculation-based determination overlap and if the calculated saliency indicator and the calculated sum of square errors lies within the overlap.

* * * * *